United States Patent
Kobayashi

(10) Patent No.: US 6,563,728 B2
(45) Date of Patent: May 13, 2003

(54) SEMICONDUCTOR MEMORY DEVICE AND METHOD FOR OPERATION THEREOF

(75) Inventor: Toshio Kobayashi, Kanagawa (JP)

(73) Assignee: Sony Corporation (JP)

( * ) Notice: Subject to any disclaimer, the term of this patent is extended or adjusted under 35 U.S.C. 154(b) by 50 days.

(21) Appl. No.: 09/876,113

(22) Filed: Jun. 8, 2001

(65) Prior Publication Data

US 2002/0014645 A1 Feb. 7, 2002

(30) Foreign Application Priority Data

Jun. 12, 2000 (JP) ........................................ 2000-180764
May 31, 2001 (JP) ........................................ 2001-163845

(51) Int. Cl.$^7$ ............................. G11C 5/06; G11C 16/04
(52) U.S. Cl. ................ 365/63; 365/185.05; 365/185.14; 365/185.16
(58) Field of Search ..................... 365/185.16, 185.05, 365/220, 63, 185.14

(56) References Cited

U.S. PATENT DOCUMENTS 5,303,187 A * 4/1994 Yu .......................... 365/185.16
5,668,757 A * 9/1997 Jeng ........................ 365/185.1
6,151,248 A * 11/2000 Harari et al. ........... 365/185.14

FOREIGN PATENT DOCUMENTS

JP         63099574 A  *  4/1988  ............ H01L/29/78

* cited by examiner

*Primary Examiner*—Richard Elms
*Assistant Examiner*—Jung H. Hur
(74) *Attorney, Agent, or Firm*—Rader, Fishman & Grauer PLLC; Ronald P. Kananen, Esq.

(57) ABSTRACT

A semiconductor memory device includes a plurality of memory cells each having, alternately provided in a word line direction, an active region (channel forming region) comprised of a first conductivity type semiconductor and impurity regions comprised of a second conductivity type semiconductor shared by adjacent memory cells. One embodiment of the method comprises driving control gates capacitively coupled with the borders of the active regions with impurity regions and electrically isolated from the word lines to electrically divide the physical memory cell array into n number of memory cell arrays, and driving the impurity regions and word lines in the same memory cell array to operate in parallel the plurality of memory cells connected to the same word line out of the cell columns.

19 Claims, 11 Drawing Sheets

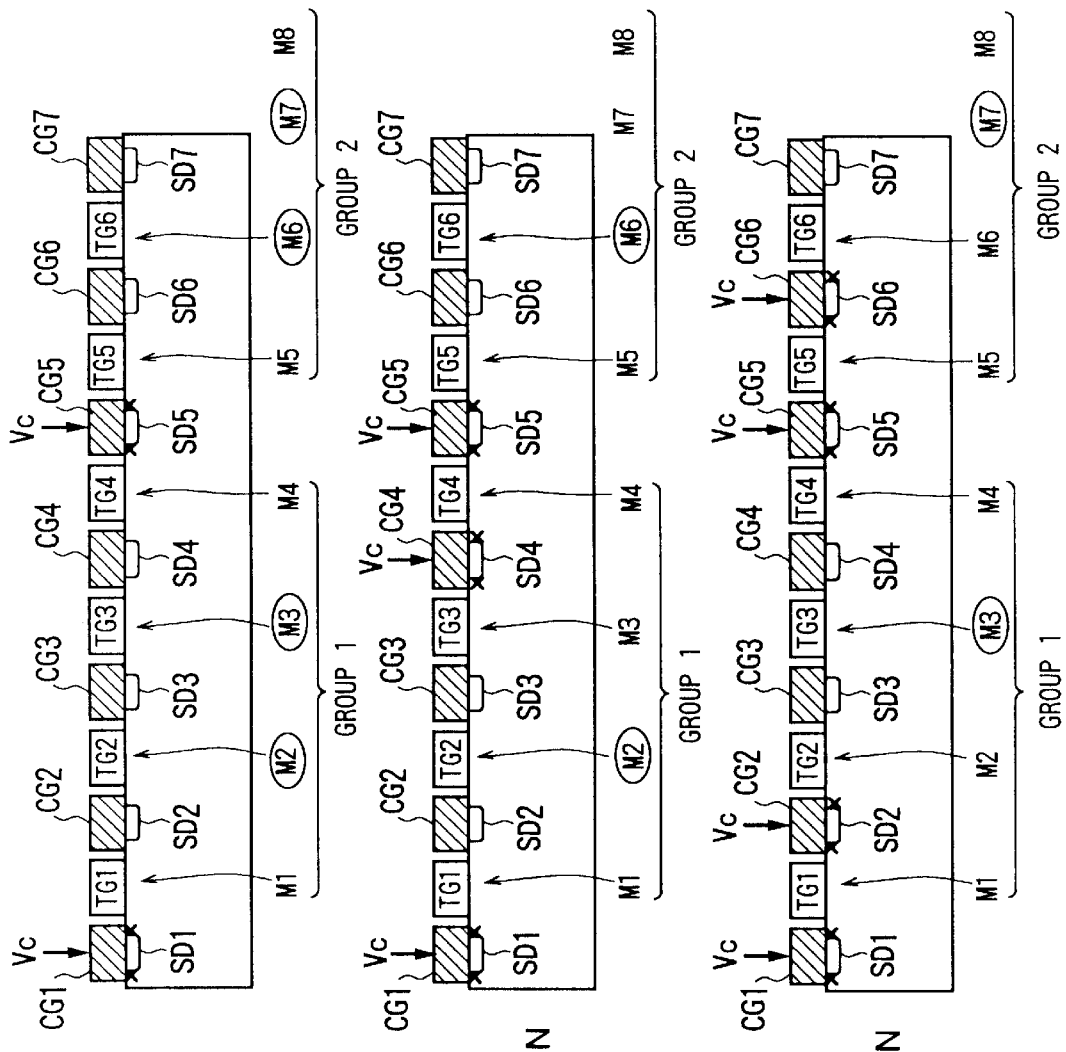

SEMICONDUCTOR MEMORY DEVICE AND METHOD FOR OPERATION THEREOF

BACKGROUND OF THE INVENTION

1. Field of the Invention

The present invention relates to a so-called virtual ground (VG) type semiconductor memory device comprising a memory cell array in which active regions (for example channel forming regions in nonvolatile memory transistors) and impurity regions (for example source and drain impurity regions in the bit line direction) shared by adjacent memory cells are provided alternately in a word line direction, and a method of operation thereof.

2. Description of the Related Art

In a VG type memory cell array structure, in the vicinity of the surface of a p-well formed in the main surface of a semiconductor substrate or a p-type semiconductor substrate, not element isolation layers, but just long n+ impurity regions (source and drain impurity regions) are repeatedly formed along a bit line direction at certain intervals in a word line direction in the form of parallel stripes.

In the vicinity of the surface of the p-well between the source and drain impurity regions, gate electrodes are stacked on a number of insulating films including charge storing means in the films or between the films. Therefore, the vicinity of the surface of the p-well functions as a channel forming region of a memory transistor.

In a floating gate (FG) type, on the gate insulating film at the bottom, a floating gate comprised of a conductive film is formed serving as a charge storing means, and above that, control gates are formed on an inter-gate insulating film comprised of an oxide-nitride-oxide (ONO) film. Usually, the control gates are also used as word lines commonly provided between memory transistors in the word line direction.

On the other hand, in a metal-oxide-nitride-oxide-semiconductor (MONOS) type, a gate electrode is formed directly on a channel forming region with an ONO film in between. In this case, the carrier traps dispersed in the boundary between a nitride film and an oxide film in the ONO film and in the nitride film work as charge storing regions. Other devices that employ such a charge forming means dispersed in a plane facing the channel and in the thickness direction include an MNOS type, a nanocrystal type, and so on. When using gate electrodes also as word lines, gate electrodes formed using isolated patterns sometimes are connected to an upper metal interconnection layer to act as word lines.

In each of the above types, the source and drain impurity regions described above function as bit lines or sub-bit lines connected with the upper layer main bit lines. In addition, the word lines are usually arranged in the form of parallel stripes intersecting with the source and drain impurity regions.

In a VG type memory cell array configured in this way, because the element isolation layers are unnecessary and the source and drain impurity regions are shared by two adjacent cells in the word line direction, there is the advantage that its memory cell area is the smallest among the many memory cell array structures.

In a VG type memory cell array, when writing or reading a memory transistor connected to a word line, a specified read drain voltage or write drain voltage is applied between two source and drain impurity regions adjoining the channel forming region of this memory transistor.

The source and drain impurity regions, however, are shared with an adjoining nonselected memory transistor in the word line direction, so the applied voltage influences the voltage on the other source and the other drain impurity regions positioned at the other sides (referred to as outside) of these nonselected memory transistors. That is, to prevent unintentional operations of the two adjoining nonselected memory transistors that share the same word line with a selected memory transistor, a voltage the same as that applied to the adjacent inside source and drain has to be applied to the two source and drain impurity regions positioned at the outsides. This is true also for the source and drain impurity regions further outside and still further outside. Therefore, once the voltage on the source and drain impurity regions of a memory transistor is defined, it influences the other outside source and drain impurity regions connected to the same word line one after another until the memory transistor at the end of the memory cell array.

Because of the above difficulty in voltage setting, in a VG type memory cell array of the related art, even if random access enabling selection of any of the plurality of memory transistors connected to a single word line is possible, serial access for simultaneously accessing a number of memory transistors is not possible. Even it is attained, it is possible only when the restriction on voltage setting is fulfilled coincidentally. This conditional access is not practical. Therefore, in a VG type memory cell array of the related art, it is not possible to freely and independently operate a plurality of memory transistors connected to a single word line.

As a result, in a nonvolatile memory device employing a VG type memory cell array of the related art, simultaneous operations of a word line or operations at a high speed close to that are not possible. Although such a device is suitable for applications requiring large capacities because of its low cost per bit, it suffers from the disadvantage that it cannot be used for applications requiring high speeds.

SUMMARY OF THE INVENTION

An object of the present invention is to provide a semiconductor memory device having a virtual ground type memory cell array capable of parallel write and read operations of a plurality of memory transistors connected to a word line and a method of operation thereof.

According to a first aspect of the present invention, there is provided a method for operating a semiconductor memory device comprising a memory cell array including a plurality of memory cells each having, alternately provided in a word line direction, an active region comprised of a first conductivity type semiconductor and impurity regions comprised of a second conductivity type semiconductor shared with adjacent memory cells; word lines capacitively coupled with the active regions; and control gates capacitively coupled with the borders of the active regions with the impurity regions and electrically isolated from the word line, the method comprising the steps of driving the control gates to electrically divide the memory cell array in the word line direction and driving the impurity regions and the word lines in the divided memory cell array to write, read, or erase the plurality of memory cells in parallel.

Preferably, a control gate is provided, for each impurity region, partly overlapping two active regions adjoining the two sides of the impurity region in the word line direction, and the method further comprises, in said step of the division, a step of applying a specific cutoff voltage on the control gate at the division point to set the control gate OFF and changing the borders of the two active regions from an electrical connection state to a cutoff state.

In this case, the number of memory cells connected to one word line is J times an integer n not less than 3, and the method further comprises a step of dividing the memory cell array into n number of memory cell arrays each including J number of memory cells according to the combination of the control gates that are set ON.

Alternatively, the word lines are comprised of i number of sub word lines (i is an integer not less than 2) and a main word line to which the i number of sub word lines are commonly connected, the number of memory cells connected to each sub word line is J times an integer n not less than 3, and the method further comprises a step of driving the control gates to electrically divide the memory cell array into n number of memory cell arrays each including J number of memory cells for each sub word line and totally (J×i) number of memory cells in the word line direction.

Specifically, the method further comprises, when electrically dividing one physical memory cell array into n number of memory cell arrays (n is an integer not less than 3), the steps of making a group of control gates in which two control gates are set ON and the following (n−2) are set OFF and cyclically repeating this set of electrical states of the group of n number of control gates in the word line direction.

The method further comprises, at the same time as the division, a step of selecting a memory cell array including a plurality of discrete memory cells capable of parallel operation.

Alternatively, the method further comprises a step of shifting the positions of the control gates in an OFF state each time by one for every (n−1) number of times in the word line direction in order to enable selection of the n (n is an integer not less than 3) number of divided memory cell arrays one after another. The method further comprises, each time the electrical state of the control gates is shifted by one in the word line direction, the steps of selecting a word line again and simultaneously writing, reading, or erasing the memory cells in parallel again in an electrically divided and selected memory cell array among the memory cells connected to the selected word line.

On the other hand, in the present invention, a first control gate partly overlapping the active region in the vicinity of the border with an impurity region adjoining one side of the active region and a second control gate partly overlapping the active region in the vicinity of the border with another impurity region adjoining the other side of the active region may be provided in pairs, and the method may further comprise a step of changing the borders of the corresponding active region from an electrical connection state to a cutoff state when the first and second control gates are set OFF.

In this case, preferably the number of memory cells connected to one word line is K times an integer m not less than 2, an the method further comprises, for each word line, a step of dividing the memory cell array into m number of memory cell arrays each including K number of memory cells according to the combination of the control gates set OFF.

Specifically, for example, when electrically dividing one physical memory cell array into m number of memory cell arrays (m is an integer not less than 2), the method further comprises the steps of selecting one group of the first control gates or one group of the second control gates on the word line, making a group of control gates in which one control gate in the selected group is set ON and the following (m−1) control gates in the same group are set OFF, cyclically repeating this set of electrical states of the group of m control gates in the selected word line direction, and setting all control gates in nonselected groups ON.

The method further comprises, at the same time as the division, a step of selecting a memory cell array including a plurality of discrete memory cells capable of parallel operation.

Alternatively, the method further comprises a step of shifting the position of the first or the second control gate in an OFF state in the selected group each time by one (m−1) number of times in the word line direction in order to enable selection of the m (not less than 2) number of divided memory cell arrays one after another. Further, the method further comprises, each time the electrical state of the control gate is shifted by one in the word line direction in the selected group, the steps of selecting a word line again and simultaneously writing, reading, or erasing the memory cells in parallel again in an electrically divided and selected memory cell array among the memory cells connected to the selected word line.

Alternatively, the method further comprises, when electrically dividing one physical memory cell array into m number of memory cell arrays (m is an integer not less than 2), the steps of making a group of a first and a second control gates by setting ON the first and second control gates sandwiching an active region capacitively coupled with said word line and positioned at two sides of the active region in the word line direction, and by setting OFF the following (m−1) pairs of the first and second control gates and cyclically repeating this set of electrical states of the 2m number of control gates in the word line direction.

The method further comprises, at the same time of the division, a step of selecting a memory cell array including a plurality of discrete memory cells capable of parallel operation.

Alternatively, the method further comprises a step of shifting the positions of the first and second control gates in an ON state each time by two (m−1) number of times in the word line direction in order to enable selection of the m (not less than 2) number of divided memory cell arrays one after another. The method further comprises, each time the electrical state of the control gates is shifted by two in the word line direction, the steps of selecting a word line again and simultaneously writing, reading, or erasing the memory cells in parallel again in an electrically divided and selected memory cell array among the memory cells connected to the selected word line.

In the method for operating a semiconductor memory device according to the first aspect of the present invention, one physical virtual ground type memory cell array is divided into a number of memory cell arrays for operation. Each memory cell array, for example, is comprised of memory cells discretely extracted out of every at least two or three memory cells. In the present invention, the discrete memory cells in one memory cell array are operated, i.e., written in, read, or erased, at one time. After the parallel operation, the selectable memory cell array is changed by shifting the division points in the word line direction to operate the memory cells in other memory cell arrays simultaneously in a similar way. As a result, by repeating the change of the selectable memory cell array and the parallel operation for the number of times the same as the number of divisions, all the memory cells in a memory cell array are written, read, or erased.

According to a second aspect of the present invention, there is provided a semiconductor memory device comprising a memory cell array including a plurality of memory cells, each having, alternately provided in a word line direction, an active region comprised of a first conductivity type semiconductor and impurity regions comprised of a second conductivity type semiconductor shared by adjacent memory cells; word lines capacitively coupled with the active regions; control gates capacitively coupled with the borders of the active regions with the impurity regions and electrically isolated from the word lines; and a control circuit for driving the control gates to electrically divide the memory cell array in the word line direction and driving the impurity regions and the word lines in the divided memory cell array to write, read, or erase the plurality of memory cells in parallel.

Preferably, a control gate is provided, for each impurity region, partly overlapping two active regions adjoining the two sides of the impurity region in the word line direction, and the control circuit changes the borders of the two active regions from an electrical connection state to a cutoff state when the control gate is set OFF. In this case, preferably, the memory cell is comprised of a nonvolatile memory transistor, the nonvolatile memory transistor comprises a plurality of gate insulating films formed on the active region in which a channel of the transistor is formed and including a charge storing means in films or between films and gate electrodes commonly connected by the word line, the control gate is provided on the plurality of gate insulating films, and comprises a conductive layer buried in the space between gate electrodes with an insulating film in between.

Alternatively, a first control gate partly overlapping the active region in the vicinity of the border of the active region with an impurity region adjoining one side of the active region and a second control gate partly overlapping the active region in the vicinity of the border of the active region with another impurity region adjoining the other side of the active region are provided in pairs, and the control circuit changes the borders of the corresponding active regions from an electrical connection state to a cutoff state when the first and second control gates are set OFF.

In this case, the memory cell is comprised of a nonvolatile memory transistor, the nonvolatile memory transistor comprises a plurality of gate insulating films formed on the active region in which a channel of the transistor is formed and including a charge storing means in films or between films and gate electrodes commonly connected by the word line, and the first and second control gates comprise two conductive layers separated from each other and formed on the plurality of gate insulating films between the gate electrodes with insulating films on their side surfaces facing each other.

In a semiconductor memory device including memory transistors having such a configuration, the control gate comprises a conductive layer buried in the space between gate electrodes or conductive layers formed between the gate electrodes with insulating films on their side surfaces facing each other. Consequently, provision of the control gates does not increase the size of a transistor.

BRIEF DESCRIPTION OF THE DRAWINGS

These and other objects and features of the present invention will become clearer from the following description of the preferred embodiments given with reference to the accompanying drawings, in which:

FIGS. 11A to 11C are views for illustrating a method of division using a plurality of consecutive control gates in a memory cell array according to the embodiments of the present invention shown by the first embodiment.

DESCRIPTION OF THE PREFERRED EMBODIMENTS

Below, preferred embodiments will be described with reference to the accompanying drawings.

First Embodiment

Figure 1:
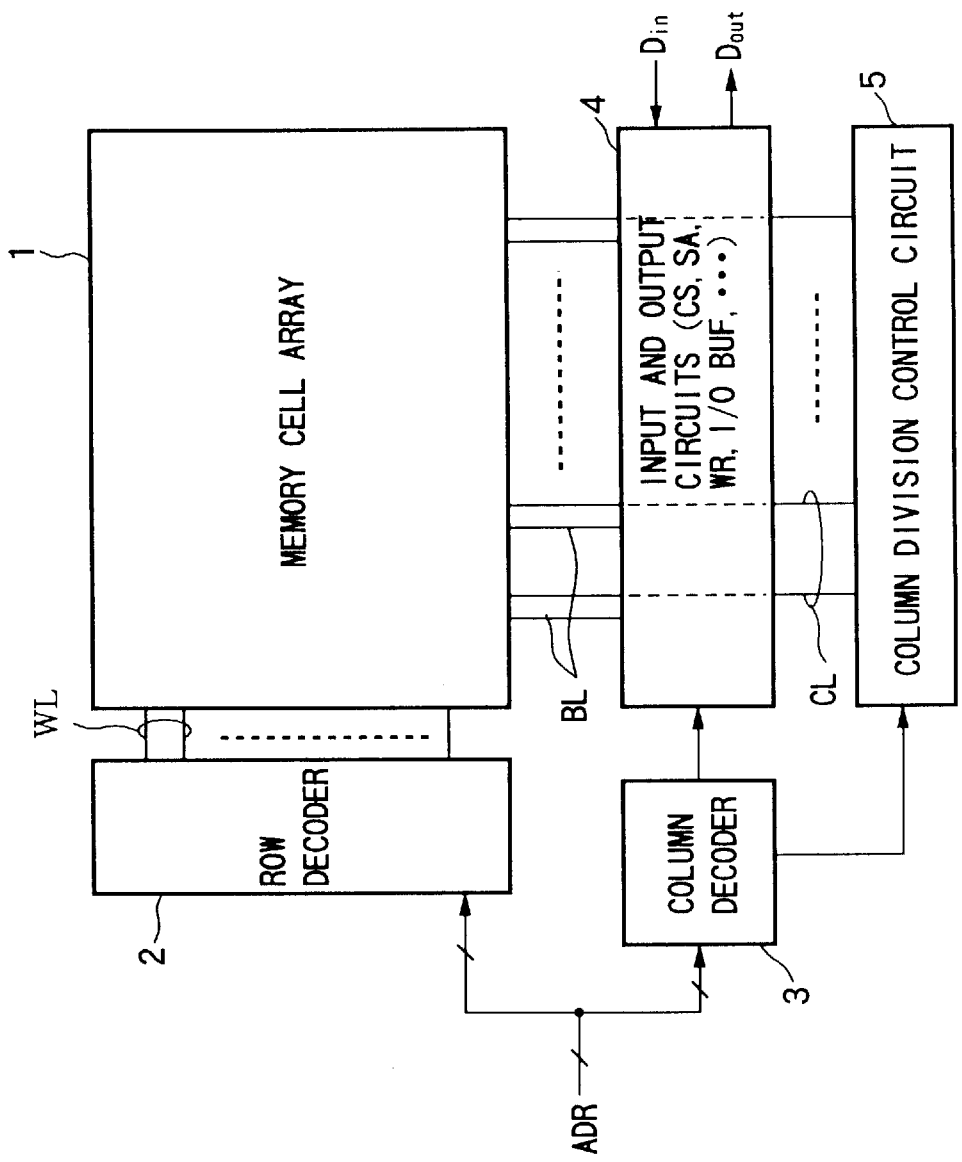
FIG. 1 is a block diagram of the configuration of principal portions of a nonvolatile semiconductor memory device according to embodiments of the present invention.

FIG. 1 is a block diagram of the configuration of principal portions of a nonvolatile semiconductor memory device according to an embodiment of the present invention.

This nonvolatile semiconductor memory device is comprised of a memory cell array 1, a row decoder 2, a column decoder 3, an input and output circuit 4, and a column division control circuit 5.

Note that some elements are omitted in FIG. 1, including a circuit which receives a signal for enabling a read, write, or erasure operation to change the operation mode or to control the timing of operation based on a clock signal, a power supply circuit, an address buffer, etc. In addition, the input and output circuit 4 in FIG. 1 includes a column selection circuit CS, a sense amplifier SA, a write circuit WR, an input and output buffer I/O BUF, etc. and all circuits related to bit lines necessary for the write or read operations.

The row decoder 2 receives an address signal ADR, selects one or all of the word lines WL laid in the memory cell array 1, and activates the selected word lines WL by changing the applied voltage to that related to a read, write, or erasure operation.

The column decoder 3 receives an address signal ADR, controls the column selection circuit CS in the input and output circuit 4 according to this signal, and selects bit lines BL laid in the memory cell array 1, for example, one out of every certain number of lines.

The column selection circuit CS connects all the selected bit lines to the sense amplifier SA when reading data and connects all the selected bit lines to the write circuit WR when writing data.

In a read operation, data retained in a memory cell is detected from the selected bit line BL by the sense amplifier SA through the column selection circuit CS. The detection result is temporarily stored in the input and output buffer I/O BUF at a specified address. As described later, this is because in the present embodiment, the data read at one time is stored in discrete bits at preset bit intervals. After reading a number of times and assembling all of one line of storage data, it is output, for example, in preset word units to an exterior data bus as the read data Dout.

Alternatively, discretely read data may also be handled as one line of storage data without buffering and output to the exterior data bus.

When writing data, input data Din from the exterior is temporarily stored in the input and output buffer I/O BUF beforehand. The one line of data is written into the memory cells while converting it from bit line voltages to the threshold voltages of the memory transistors by several write operations in units of the plurality of bit lines BL discretely selected by the column selection circuit CS.

Alternatively, when input data Din from the exterior is sent as one line of storage data to be discretely written, the input data may be successively written in the memory cell array without buffering.

The memory cell array 1 according to the present embodiment, as described later in detail, is provided with control gate lines CL, serving as common lines in the bit line direction, in pairs with the bit lines BL. In the present embodiment (the first embodiment), there is one control gate line CL corresponding to one bit line BL, but in the second embodiment described later, there are two control gate lines CL for each bit line BL.

The control gates CL are connected to the column division control circuit 5.

The column division control circuit 5 receives a control signal decoded at the column decoder 3 and divides a row of memory cells connected to one word line or changes the division points according to a predetermined rule. Specifically, it switches the voltage of a control gate line CL to be made a division point from an initial voltage to a cutoff voltage or switches it from the cutoff voltage to the initial voltage to release the division point.

Figure 2:
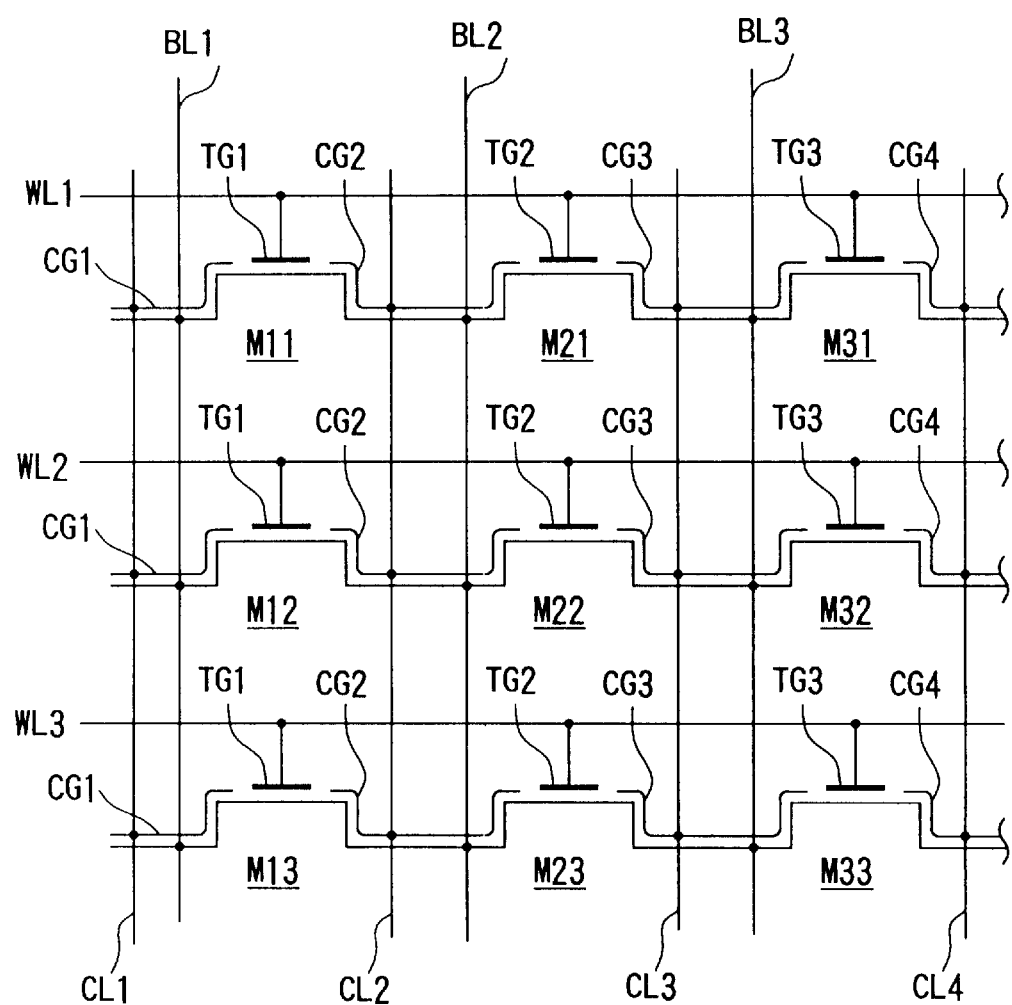
FIG. 2 is a partial circuit diagram of a memory cell array according to a first embodiment.

FIG. 2 is a circuit diagram of a memory cell array.

In the memory cell array 2, each memory cell is comprised of a single memory transistor. For example, j×i number of memory transistors M11, M21, . . . , Mj1, M12, M22, . . . , Mj2, M13, M23, . . . , Mj3, . . . , M1i, . . . , Mji are arranged in matrix. In FIG. 2, only 3×3 number of memory cells are illustrated.

Gates of memory transistors in each row are connected to the same word line. Namely, transistor gates TG1, TG2, TG3, . . . of memory transistors M11, M21, M31, . . . are connected to a word line WL1. Similarly, transistor gates of memory transistors M12, M22, M32, . . . are connected to a word line WL2, and transistor gates of memory transistors M13, M23, M33, . . . are connected to a word line WL3.

The source of each memory transistor is connected to the drain of an adjoining memory transistor on one side in the word line direction, while the drain of the same memory transistor is connected to the source of the adjoining memory transistor on the other side in the word line direction. These shared sources and drains are comprised of line-like source and drain impurity regions joining the connection portions of other sources and drains in the bit line direction.

The source and drain impurity regions formed in this way in the memory cell array as a whole form a parallel stripe pattern. These source and drain impurity regions themselves may be used as bit lines BL1, BL2, BL3, . . . Alternatively, an upper metal interconnection layer may be provided on the source and drain impurity regions to serve as the bit lines BL1, BL2, BL3, . . . In the latter case, the bit lines BL1, BL2, BL3, . . . are arranged in the bit line direction while keeping good contact with the corresponding source and drain impurity regions beneath.

In the present embodiment, above each source and drain impurity region, a control gate is provided partly overlapping the ends of the active regions (channel forming regions) of two memory transistors on the two sides of the source and drain region along the word line direction.

Specifically, viewed along the word line direction, there are provided a control gate CG1 partly overlapping the channel forming region of the memory transistor M11, a control gate CG2 partly overlapping the channel forming regions of the memory transistors M11 and M21, a control gate CG3 partly overlapping the channel forming regions of the memory transistors M21 and M31, a control gate CG4 partly overlapping the channel forming regions of the memory transistors M31 and M41 (not shown), . . . These control gates are arranged long in the bit line direction and can be directly used as control gate lines CL1, CL2, CL3, CL4, . . . Alternatively, control gates CG1, control gates CG2, control gates CG3, control gates CG4, . . . may also be connected through control gate lines CL1, CL2, CL3, CL4, . . . given by an upper metal interconnection layer.

Figure 3:
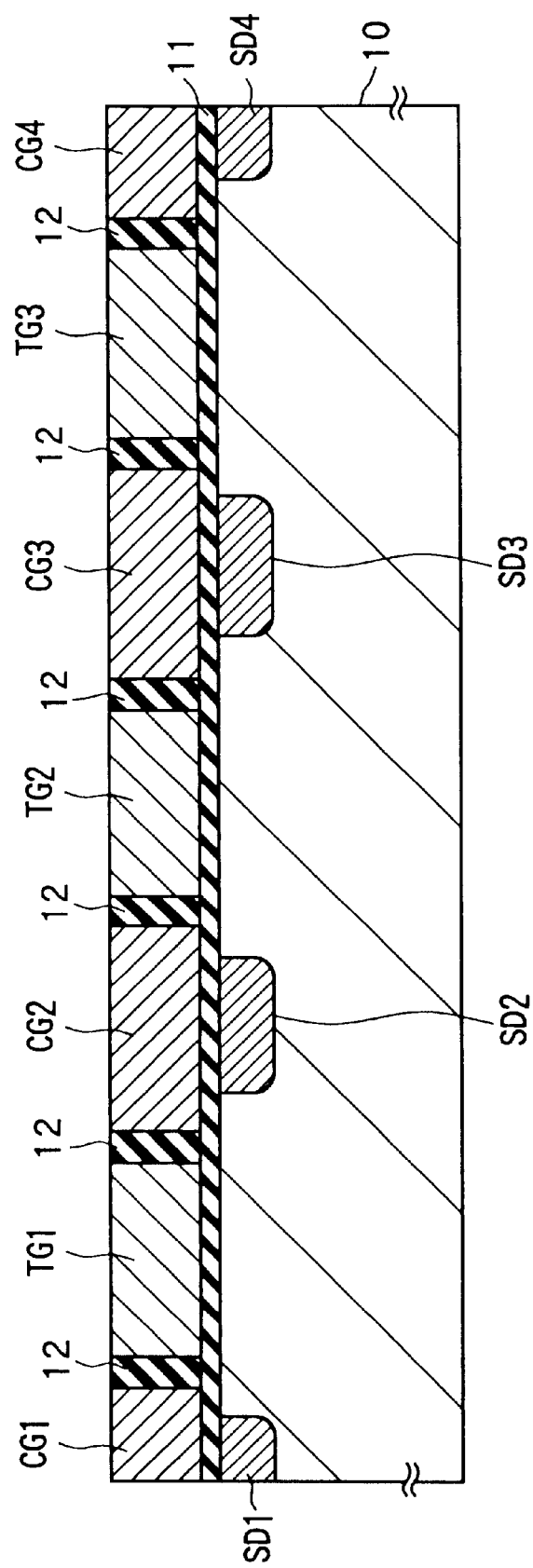
FIG. 3 is a sectional view of principal portions of the memory cell array according to the first embodiment in a word line direction.

FIG. 3 is a schematic sectional view of a memory cell array in the word line direction. Here, the memory cell is shown to be comprised of an n-channel MOS transistor, but of course a semiconductor of an opposite conductivity type may also be used.

At the surface in a semiconductor substrate or a semiconductor layer (for example, an SOI layer) supported by a substrate, a p-well 10 is formed. At the surface in the p-well 10, source and drain impurity regions SD1, SD2, SD3, SD4, . . . comprised of n+ impurity regions are formed in the word line direction at regular intervals. The surface of the p-well in the separation space between impurity regions forms a channel forming region of these memory transistors.

On the channel forming regions and source and drain impurity regions SD1, SD2, . . . , an insulating film 11 is formed. Further, control gates CG1, CG2, CG3, CG4, . . . and transistor gates TG1, TG2, TG3, . . . comprised of polysilicon or metal are arranged alternately. Isolation insulating films 12 are interposed between facing sides of control gates and transistor gates.

Control gates CG1, CG2, CG3, CG4, . . . are arranged aligned at their centers of width with the source and drain impurity regions SD1, SD2, SD3, SD4, . . . The edges of the two sides of a control gate along the width direction partly overlap channel forming regions outside the source and drain impurity region.

The overlapping portions of channel forming regions and a control gate are referred to as "borders" in the present invention. When a control gate is controlled by the column division control circuit 5 shown in FIG. 1 and is supplied with a cutoff voltage, these two borders shift from a connection state to a cutoff state. Here, in addition to the meaning that a border is electrically connected or disconnected, the term "connection state" also indicates a state in which a channel can be formed in a memory transistor as desired, while the term "cutoff state" also indicates a state in which a channel cannot be formed even under a bias condition for forming the channel, namely, being kept in a channel OFF state.

Transistor gates TG1, TG2, TG3, . . . are arranged aligned at their centers of width with those of channel forming regions.

Note that, although not shown in FIG. 3, in the case of a MONOS type, at least in the insulating film 11 beneath a control gate, there is formed a stacked layer structure of a number of insulating films including the boundary surface of an oxide film and a nitride film. Further, in case of an FG type or a nanocrystal type, a number of insulating films are formed at least beneath a control gate, and between two films there is buried a single conductive film or a conductive material containing a large number of dispersed fine particles. This conductive material, or the carrier traps in the boundary surface between the oxide film and the nitride film and in the nitride film, function as a charge storing means of the memory transistor.

The threshold voltage Vth of a memory transistor changes with the amount of charge stored in the charge storing means. When writing data using channel hot electron injection, the amount of the stored charge depends on the transverse electric field applied to the channel set ON during a write operation. The transverse electric field is determined according to the bit line voltage. That is, the data to be written, which is transmitted to memory cells representing whether or not a voltage is set on bit lines, is stored in memory cells transformed to differences of threshold voltages Vth during a write operation.

When reading data, while a specified read drain voltage is applied between two bit lines, a voltage that turns memory transistors ON or OFF according to the logic of the storage data is applied to gates of the transistors through the word line. Therefore, only when a memory transistor is turned ON, a current flows between two bit lines in a channel and the bit line voltage changes. The presence of a change of the bit line potential is detected and read out by using the sense amplifier SA. That is, when reading data, reverse to a write operation, the difference of the threshold voltage Vth of a memory transistor is transformed to a difference of the bit line potential, whereby the storage data become available for transmission to the exterior.

Figure 4A:
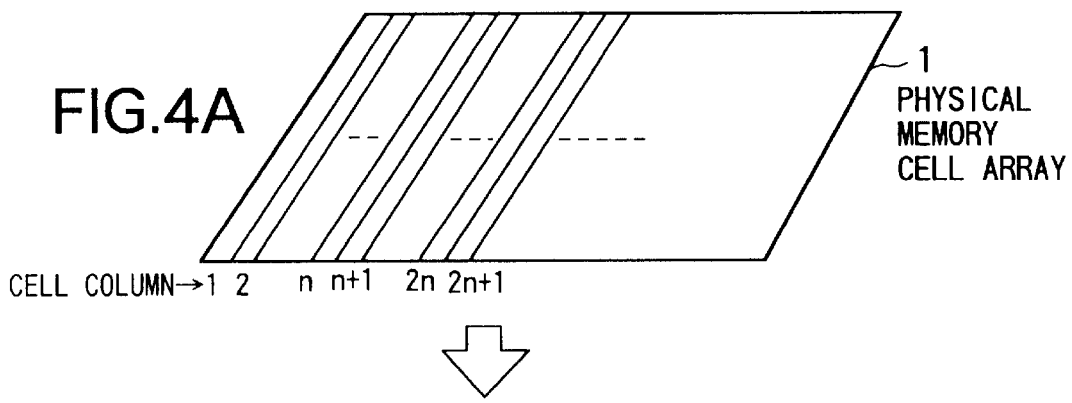
FIGS. 4A and 4B are conceptual views for illustrating division of a memory cell array according to the first embodiment.
Figure 4B:
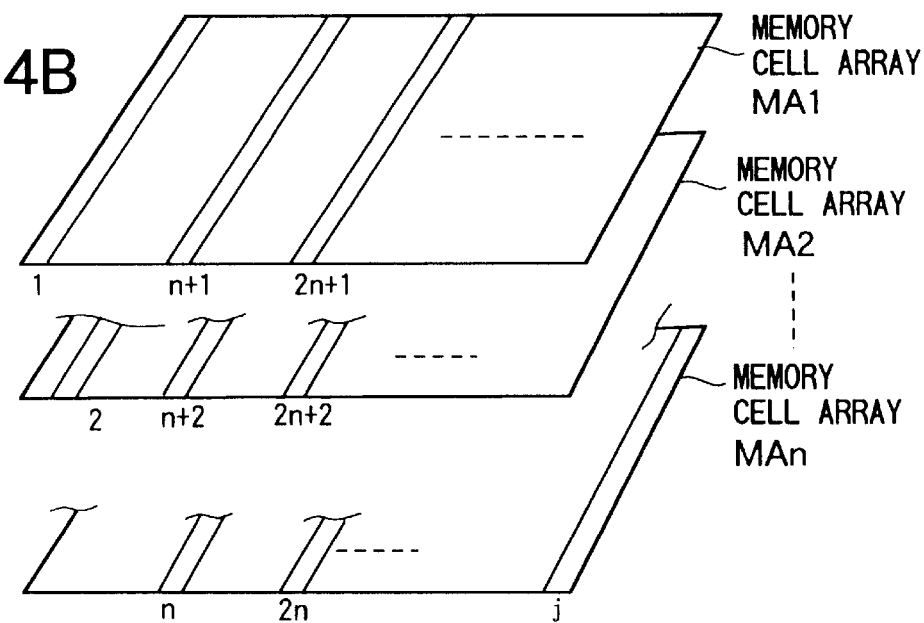

FIGS. 4A and 4B are conceptual views for illustrating division of a memory cell array according to the present embodiment.

FIG. 4A is the physical memory cell array 1. In FIGS. 4A and 4B, the memory cell columns are assigned serial numbers 1, 2, . . . , n, n+1, . . . , 2n, 2n+1, . . . , j.

In the present embodiment, in a write, read, or erasure operation, the column division control circuit 5 shown in FIG. 1 divides the memory transistor array in the word line direction into a number of parts and hence divides a memory cell array into n number of memory cell arrays MA1, MA2, . . . , MAn, where n is an integer not less than 3 (FIG. 4B). The memory cell arrays MA1, MA2, . . . , MAn each include periodically discrete memory cell columns. For example, the memory cell array MA1 includes memory cell columns 1, n+1, 2n+1, . . . , the memory cell array MA2 includes memory cell columns 2, n+2, 2n+2, . . . , and the last memory cell array MAn includes memory cell columns n, 2n, . . . , j (FIG. 4B).

In the present embodiment, memory transistors in any selected memory cell array are operated in parallel.

Figure 5:
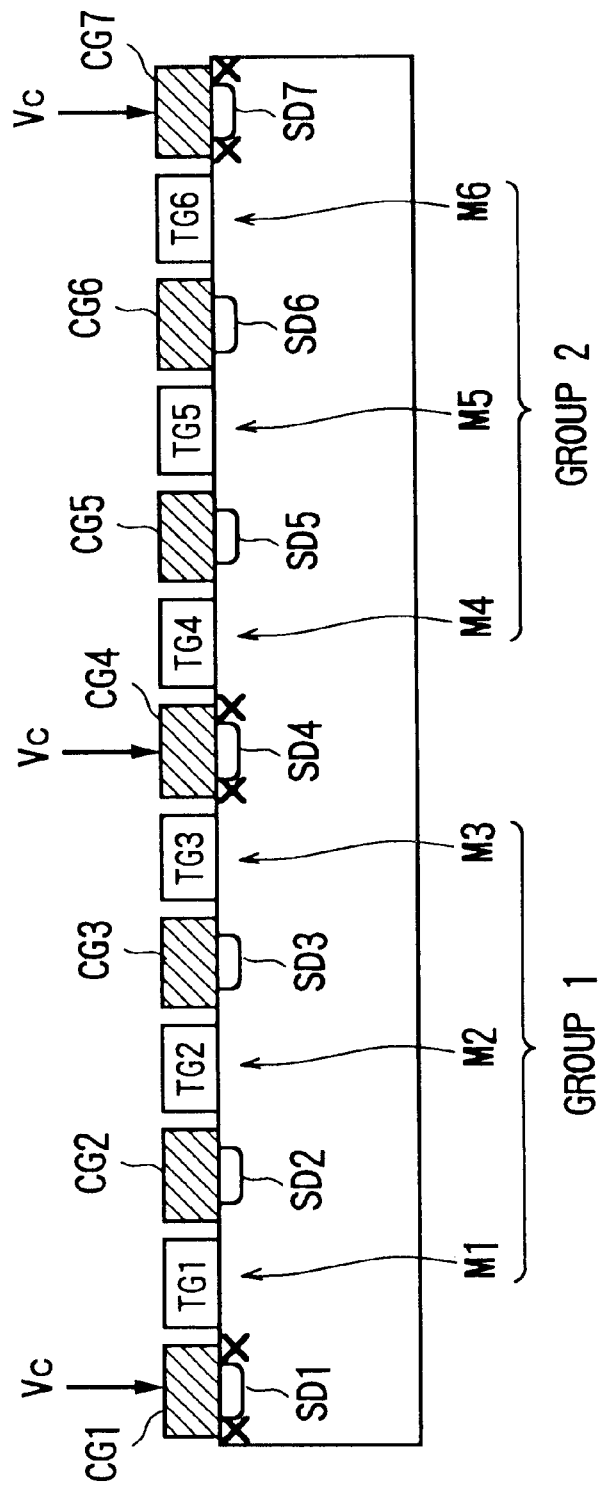
FIG. 5 is a view for illustrating an operation for dividing a memory cell array in the word line direction according to the first embodiment.

FIG. 5 is a view for illustrating a division operation for a memory cell row specifically connected to one word line.

Here, the explanation will be made of the case of division into groups of three memory cells.

First, before a write and read operation, the column division control circuit 5 applies a cutoff voltage Vc every preset number (three) of the control gate lines CL1, CL2, CL3, CL4, . . . Here, for example, the cutoff voltage Vc is applied to the control gate lines CL1, CL4, CL7, . . . When the cutoff voltage Vc is transmitted to the control gates CG1, CG4, CG7, . . . , the borders of channel forming regions to which the control gates are capacitively coupled shift from a connection state to a cutoff state (indicated by an X in the figure). As a result, the memory transistors in the word line direction are divided into a group 1 including memory transistors M1, M2, and M3, a group 2 including memory transistors M4, M5, and M6, . . . , and so on.

The memory transistors M1, M3, M4, M6, . . . which have borders in a cutoff state at these division points are incapable of being operated since channels cannot be formed under the bias conditions of operation. The source-drain impurity regions SD2, SD3, SD5, SD6, . . . located inside the groups of memory transistors unable to be operated can be set with any voltages. Therefore, the memory transistors M2, M5, . . . at the centers of the groups become selectable. These discrete memory transistors M2, M5, . . . form the memory cell array MA2 shown in FIG. 4B.

Therefore, in the present embodiment, the memory transistors are physically divided into a number of groups in the word line direction, whereby one of the n number of memory cell arrays MA1, MA2, . . . MAn enters a selectable state.

Then, a specified word line voltage and bit line voltage are supplied to the selectable memory cell array MA2 so as to write, read, or erase all memory cells in the memory cell array MA2 in parallel.

In the next operation cycle, the column division control circuit 5 shifts one memory cell's worth to one side in the word line direction to apply a cutoff voltage Vc to the control gates. Therefore, the selectable memory transistors become for example M3, M6, . . . , the memory cell array MA3 is selected, and all memory cells in the memory cell array MA3 are written, read, or erased in parallel.

Further, in the next operation cycle, the column division control circuit 5 shifts by another memory cell's worth to the same side in the word line direction to apply a cutoff voltage Vc to the control gates. Therefore, the selectable memory transistors become for example M1, M4, . . . , the memory cell array MA1 is selected, and all memory cells in the memory cell array MA1 are written, read, or erased in parallel.

Therefore, by repeating the operation cycle the same number of times as the number n of memory transistors in a divided group (here, three), the operation of all memory cells connected to a word line is completed.

The operation is the same for other rows. A desired word line is suitably selected by the row decoder 2 and the write, read, or erasure operation is repeated in the above three operation cycles.

To minimize the number of operation cycles for one row, it is desirable to form groups each including three cells, i.e., to divide the array into three memory cell arrays, but in the present embodiment, the memory cells may also be divided into groups each including 4 or more cells.

As described previously, in the virtual ground type memory cell arrays of the related art, in order to prevent erroneous operations of other memory cells than the selected memory cells, the values of the voltages set at their source and drain impurity regions are fixed to the same voltage setting as that of the source and drain impurity regions of the selected memory cells.

In the present embodiment, the restrictions on the voltage setting can be confined to each group. This is because the influence of the voltage settings of the selected memory cells in a group is cut at the division points, and different groups do not interfere with each other. As a result, it become possible to select any memory cell in each group and operate all these memory cells in the word line direction simultaneously. Consequently, the operating speed of a virtual ground type memory cell array is increased.

The additionally provided control gates for this control, as shown in FIG. 3, are buried in the separation space between transistor gates. Since this space for providing the control gates is originally required for forming source and drain impurity regions of a certain width, the provision of the control gates does not cause an increase of the cell area at all. Therefore, the cell area is maintained as small as that of the related art.

Second Embodiment

Figure 6:
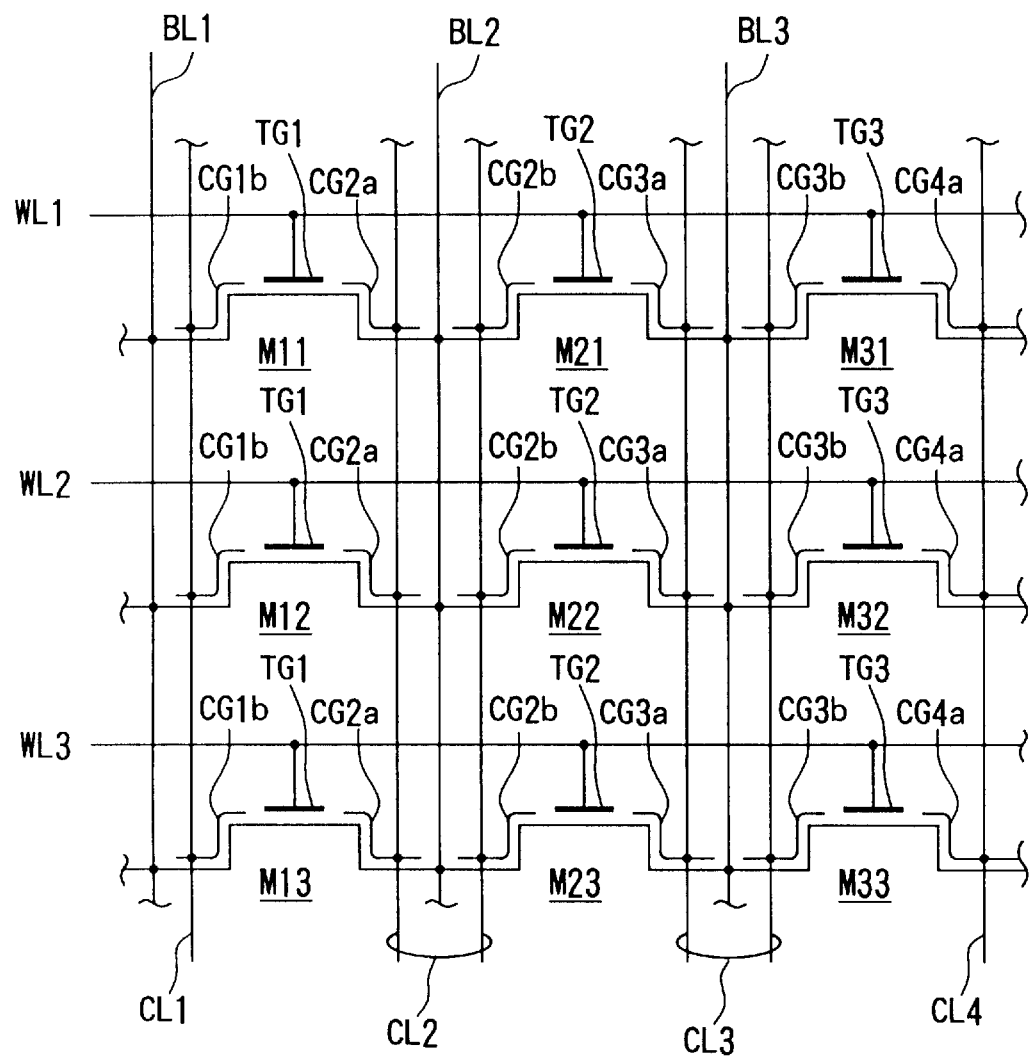
FIG. 6 is a partial circuit diagram of a memory cell array according to a second embodiment.
Figure 7:
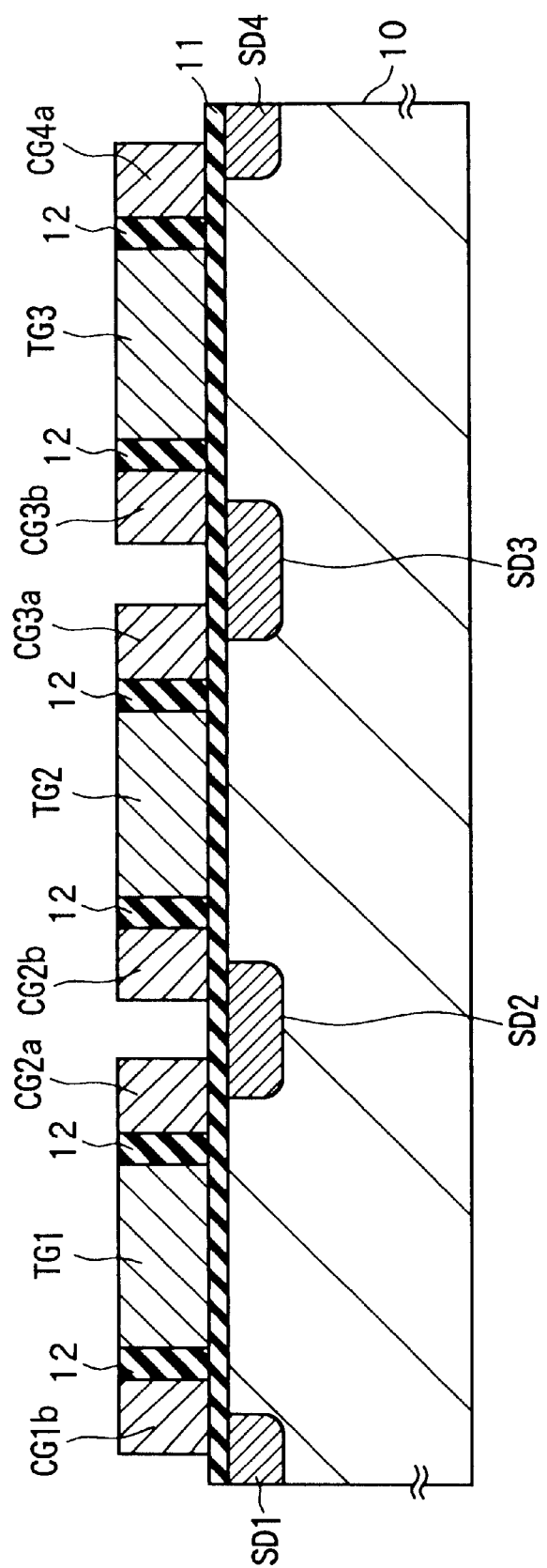
FIG. 7 is a sectional view of principal portions of the memory cell array according to the second embodiment in the word line direction.

FIG. 6 is a circuit diagram of a memory cell array according to the second embodiment, while FIG. 7 is a sectional view of the principal portions of the memory cell array in the word line direction.

In this memory cell array, a control gate CGi (i=1, 2, 3, . . . ) includes a first control gate CGia and a second control gate CGib. The first and second control gates CGia and CGib are provided on the same source and drain impurity region SDi.

As shown in FIG. 7, the first control gate CGia is comprised of a conductive layer formed on a side surface of the transistor TG(i−1) with an insulating film 12 in between and partly overlaps the channel forming region beneath the transistor gate TG(i−1). The second control gate CGib is comprised of a conductive layer formed on a side surface of the transistor TGi with an insulating film 12 in between and partly overlaps the channel forming region beneath the transistor gate TGi. The first control gate CGia and the second control gate CGib are separated above the source and drain impurity region SDi electrically and spatially. Although not illustrated in the figure, the first control gate CGia and the second control gate CGib are made available from the outside of the memory cell array as separate control gate lines CL.

The rest of the configuration in the circuit diagram and the sectional view are the same as the first embodiment, and the same configuration of the peripheral circuits as in FIG. 1 is employed, except that the column division control circuit 5 in the present embodiment is configured so that the control gate lines CL provided in pairs with the bit lines BL are individually controllable.

Figure 8:
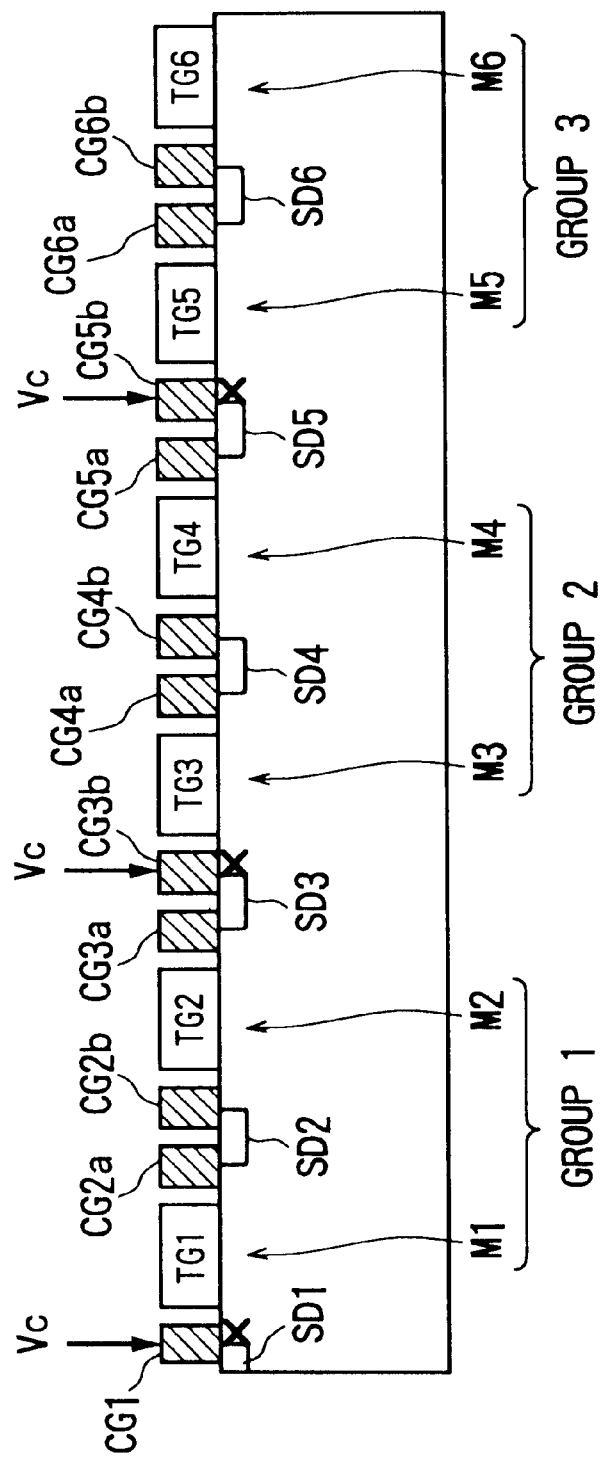
FIG. 8 is a view for illustrating an operation for dividing a memory cell array in the word line direction according to the second embodiment.

FIG. 8 is a view illustrating a division operation. Here, the explanation will be made of the case of division into groups each including two memory cells.

First, before a write and read operation, the column division control circuit 5 drives either the first control gate CGia or the second control gate CGib among the control gate lines CL1, CL2, . . . Here, the second control gate CGib side is driven. The column division control circuit 5 applies a cutoff voltage Vc to one of every preset number (e.g., two) of a number of the second control gates CGib. Here, the cutoff voltage Vc is applied to the control gates CG1b, CG3b, CG5b, . . . The borders of the channel forming regions where the control gates applied with the cutoff voltage Vc are capacitively coupled shift from a connection state to a cutoff state (indicated by an X in the figure). As a result, the memory transistors in the word line direction are divided into a group 1 including memory transistors M1 and M2, a group 2 including memory transistors M3 and M4, a group 3 including memory transistors M5 and M6, . . . , and so on.

Therefore, the memory transistors M1, M3, M5, . . . which have borders in a cutoff state at these division points become inoperable since channels cannot be formed under the bias conditions of operation. On the other hand, in the present embodiment, the division points are at only one side (the side of the second control gates) of the source and drain impurity regions SD1, SD3, SD5, . . . The borders at the other side (the side of the first control gate) remain in a connection state. Therefore, the memory transistors M2, M4, M6 . . . at the side of the first control gates become selectable. These discrete memory transistors M2, M4, M6 . . . form the memory cell array MA2 shown in FIG. 4B.

After that, a specified word line voltage and bit line voltage are applied to the selectable memory cell array MA2, and all memory cells in the memory cell array MA2 are written, read, or erased in parallel.

In the next operation cycle, the column division control circuit 5 shifts the second control gates CGib for applying the cutoff voltage by one memory cell's worth to one side in the word line direction to apply the cutoff voltage Vc. Therefore the memory transistors M1, M3, M5 . . . become selectable. These discrete number of memory transistors M1, M3, M5 . . . form the memory cell array MA1 shown in FIG. 4B.

After that, a specified word line voltage and bit line voltage are applied to the selectable memory cell array MA1, and all memory cells in the memory cell array MA1 are written, read, or erased in parallel.

Note that the memory transistors M1, M3, M5, . . . forming the memory cell array MA1 can also be made selectable by, for example, shifting the cutoff voltage Vc from the second control gates CGib to the first control gates CGia.

Therefore by repeating the operation cycle the same number of times as the number n of memory transistors in a divided group (here, two), the operation of all memory cells connected to one word line is completed.

The operation is the same for other rows. In the above two operation cycles, a desired word line is suitably selected by the row decoder 2, and the write, read, or erasure operation is repeated.

Note that, in the present embodiment, to minimize the number of operation cycles for one row, it is desirable to form groups each including two cells, but the memory cells may also be divided into groups each including three or more cells.

Figure 9:
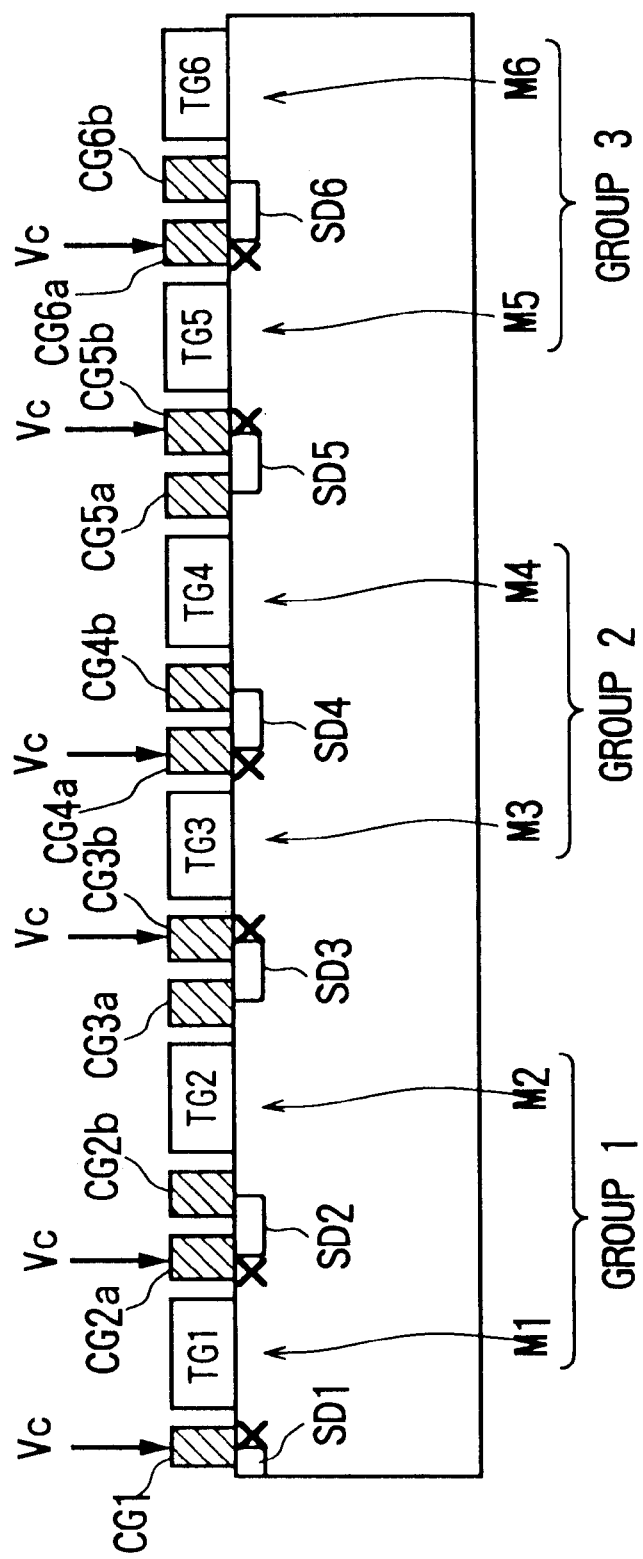
FIG. 9 is a view of a first modification of the method for dividing a memory cell array according to the second embodiment.
Figure 10:
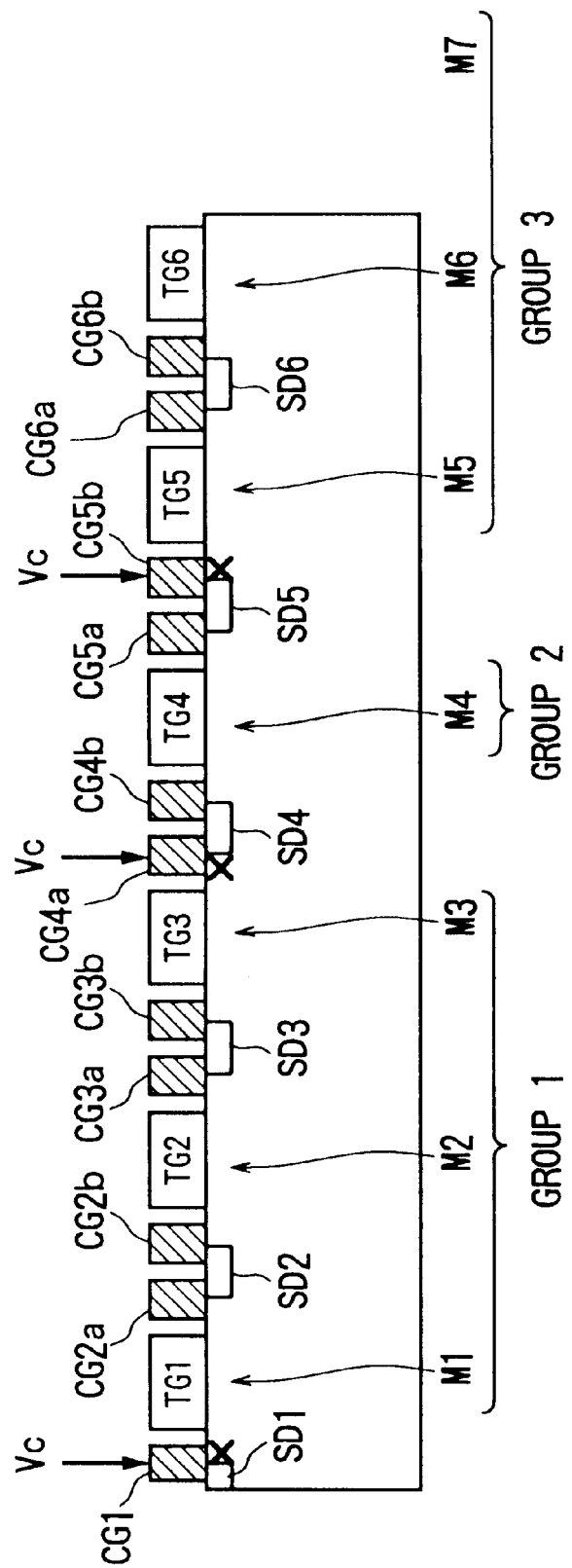
FIG. 10 is a view of a second modification of the method for dividing a memory cell array according to the second embodiment.

In the second embodiment, there are numerous methods of changing the positions of applying the cutoff voltage Vc for division. FIG. 9 and FIG. 10 illustrate other methods.

In FIG. 9, while the effect is the same as that of the case of FIG. 8, both the first and the second control gates at the two sides of the transistor gates TG1 and TG3 of the inoperable memory transistors M1 and M3 are set OFF. Then the first control gate and the second control gate are set OFF alternately as shown above. In this way, the divided memory cell arrays can be selected alternately.

In FIG. 10, at the transistor gate TG1, the second control gate CG1 at the left side is set OFF, while at the transistor gate TG3 at the next division point, the first control gate CG4a at the right side is set OFF. In this way, the following first control gates and second control gates are set ON alternately. Therefore the numbers of memory transistors in a group become 3, 1, 3, 1, . . . The number of memory transistors in a group are not the same. In this case, however, the currently selectable memory transistors are still M2, M4, . . . Next, the selectable memory transistors when the position for applying the cutoff voltage Vc is shifted by one cell are M1, M3, M5, . . . This is exactly the same as the cyclical repetition of the memory cell array shown in FIGS. 4A and 4B. In other words, this modification shows that in the present invention, a cyclical selection of the memory cell array is possible even the division points are not uniformly located.

The second embodiment also gives the same effects as the first embodiment. That is, it is possible to select any memory cell in each group. All the memory cells in the word line direction are operated simultaneously, therefore, the operating speed of a virtual ground type memory cell array is increased. In addition, the provision of the control gates does not cause an increase of the cell area at all.

In the above first and second embodiments, in order for the number of the selectable memory cells to be made one in each group, a row of memory cells is divided by three in the first embodiment and by two (or by a combination of three and one) in the second embodiment.

However, as described above, it is possible to form groups each including four or more memory cells in the first embodiment and three or more in the second embodiment. In this case, each group includes two or more consecutive selectable memory cells. Namely, two or more memory cell arrays are in the selectable state simultaneously. In this case, it is necessary to select one memory cell array. The method for doing this may include the steps of, as described above, determining the voltage applied to the bit lines of the memory transistors to be selected and applying the same voltage as that on the bit line to the outside adjacent bit lines to make the lines nonselected. However, the method as shown below may also be used.

FIGS. 11A–11C are views for illustrating the method of division in which n equals 4 in the first embodiment.

If n=4 in the first embodiment, as shown in FIG. 11A, when the cutoff voltage Vc is applied to one of every four control gates, two memory cells become selectable in each group. Namely, in FIG. 11A, the memory cell arrays MA2 and MA3 are both selected. It is necessary to select one of the two memory cell arrays. For this, as shown in FIGS. 11B and 11C, a cutoff voltage Vc is applied to two consecutive control gates, and the group of control gates applied with the cutoff voltage Vc is shifted in the word line direction by one control gate each time. Therefore the memory cell array MA2 alone is selected in FIG. 11B, and the memory cell array MA3 alone is selected in FIG. 11C.

This method also works for n=5 or more. For example, when n=5, groups each having three consecutive control gates are repeated in the word line direction. Shifting them by one control gate each time in the word line direction changes the selection of a different memory cell array.

In principle, the method also works for the second embodiment which involves groups each including two control gates.

Therefore, in the present invention, the number n of the memory cell arrays can be set to any number. The number of the consecutive control gates at division points applied with cutoff voltage can be correspondingly set to (n−2).

Summarizing the effects of the present invention, according to the operating method of the semiconductor memory device according to the present invention, in a so-called virtual ground type memory cell array, a number of memory cells in the word line direction can be written, read, or erased in parallel. In this operation, writing or reading of all the memory cells connected to one word line can be attained by operations the same number of times as the number of divided memory cell arrays. By minimizing the number of the divided memory cell arrays as much as possible during this operation, the user friendliness and operating speed are greatly improved.

Further, according to the semiconductor memory device according to the present invention, the provision of control gates does not increase the area of the memory cell array, and the cost per bit remains at the same level as the conventional ones even including peripheral circuits.

While the invention has been described with reference to specific embodiment chosen for purpose of illustration, it should be apparent that numerous modifications could be made thereto by those skilled in the art without departing from the basic concept and scope of the invention.

What is claimed is:

1. A method for operating a semiconductor memory device comprising a memory cell array including a plurality of memory cells each having, alternately provided in a word line direction, an active region comprised of a first conductivity type semiconductor and impurity regions comprised of a second conductivity type semiconductor shared with adjacent memory cells, word lines capacitively coupled with the active regions, and control gates capacitively coupled with the borders of the active regions with the impurity regions and electrically isolated from the word line, each control gate partly overlapping two active regions adjoining the two sides of the impurity region in the word line direction, the number of memory cells connected to one word line is J times an integer n not less than 3, the method comprising the steps of:
driving the control gates to electrically divide the memory cell array in the word line direction by applying a specific cutoff voltage on the control gate at the division point to set the control gate OFF and by changing the borders of the two active regions from an electrical connection state to a cutoff state;
driving the impurity regions and the word lines in the divided memory cell array to write, read, or erase the plurality of memory cells in parallel; and
dividing the memory cell array into n number of memory cell arrays each including J number of memory cells according to the combination of the control gates that are set OFF.

2. A method for operating a semiconductor memory device as set forth in claim 1, comprising, when electrically dividing one physical memory cell array into n number of memory cell arrays (n is an integer not less than 3), the steps of:
making a group of control gates in which two control gates are set ON and the following (n−2) are set OFF; and
cyclically repeating this set of electrical states of the group of n number of control gates in the word line direction.

3. A method for operating a semiconductor memory device as set forth in claim 2, further comprising, at the same time as the division, a step of selecting a memory cell array including a plurality of discrete memory cells capable of parallel operation.

4. A method for operating a semiconductor memory device as set forth in claim 2, comprising a step of shifting the positions of the control gates in an OFF state each time by one for every (n−1) number of times in the word line direction in order to enable selection of the n (n is an integer not less than 3) number of divided memory cell arrays one after another.

5. A method for operating a semiconductor memory device as set forth in claim 4, further comprising, each time the electrical state of said control gates is shifted by one in the word line direction, the steps of:
 selecting a word line again; and
 simultaneously writing, reading, or erasing the memory cells in parallel again in an electrically divided and selected memory cell array among the memory cells connected to the selected word line.

6. A method for operating a semiconductor memory device comprising a memory cell array including a plurality of memory cells each having, alternately provided in a word line direction, an active region comprised of a first conductivity type semiconductor and impurity regions comprised of a second conductivity type semiconductor shared with adjacent memory cells, word lines capacitively coupled with the active regions, and control gates capacitively coupled with the borders of the active regions with the impurity regions and electrically isolated from the word line, each control gate partly overlapping two active regions adjoining the two sides of the impurity region in the word line direction, the word lines are comprised of i number of sub word lines (i is an integer not less than 2) and a main word line to which the i number of sub word lines are commonly connected,
 the method comprising the steps of:
  driving the control gates to electrically divide the memory cell array in the word line direction by applying a specific cutoff voltage on the control gate at the division point to set the control gate OFF and changing the borders of the two active regions from an electrical connection state to a cutoff state;
  driving the impurity regions and the word lines in the divided memory cell array to write, read, or erase the plurality of memory cells in parallel; and
  driving said control gates to electrically divide said memory cell array into n number of memory cell arrays each including J number of memory cells for each sub word line and totally (J×i) number of memory cells in the word line direction.

7. A method for operating a semiconductor memory device comprising a memory cell array including a plurality of memory cells each having, alternately provided in a word line direction, an active region comprised of a first conductivity type semiconductor and impurity regions comprised of a second conductivity type semiconductor shared with adjacent memory cells, word lines capacitively coupled with the active regions, and a first control gate partly overlapping said active region in the vicinity of the border with an impurity region adjoining one side of the active region and a second control gate partly overlapping the active region in the vicinity of the border with another impurity region adjoining the other side of the active region are provided in pairs, the number of memory cells connected to one word line is K times an integer m not less than 2,
 the method comprising a steps of:
  driving the control gates to electrically divide the memory cell array in the word line direction;
  driving the impurity regions and the word lines in the divided memory cell array to write, read, or erase the plurality of memory cells in parallel;
  changing the borders of the corresponding active region from an electrical connection state to a cutoff state when the first and second control gates are set OFF; and
  dividing said memory cell array into m number of memory cell arrays each including K number of memory cells according to the combination of the control gates set OFF.

8. A method for operating a semiconductor memory device as set forth in claim 7, comprising, when electrically dividing one physical memory cell array into m number of memory cell arrays (m is an integer not less than 2), the steps of:
 selecting one group of the first control gates or one group of the second control gates on the word line;
 making a group of control gates in which one control gate in the selected group is set ON and the following (m−1) control gates in the same group are set OFF;
 cyclically repeating this set of electrical states of the group of m control gates in the selected word line direction; and
 setting all control gates in nonselected groups ON.

9. A method for operating a semiconductor memory device as set forth in claim 8, further comprising, at the same time as the division, a step of selecting a memory cell array including a plurality of discrete memory cells capable of parallel operation.

10. A method for operating a semiconductor memory device as set forth in claim 8, further comprising a step of shifting the position of the first or the second control gate in an OFF state in the selected group each time by one (m−1) number of times in the word line direction in order to enable selection of the m (not less than 2) number of divided memory cell arrays one after another.

11. A method for operating a semiconductor memory device as set forth in claim 10, further comprising, each time the electrical state of said control gate is shifted by one in the word line direction in the selected group, the steps of:
 selecting a word line again; and
 simultaneously writing, reading, or erasing the memory cells in parallel again in an electrically divided and selected memory cell array among the memory cells connected to the selected word line.

12. A method for operating a semiconductor memory device as set forth in claim 7, comprising, when electrically dividing one physical memory cell array into m number of memory cell arrays (m is an integer not less than 2), the steps of:
 making a group of a first and a second control gates by setting ON the first and second control gates sandwiching an active region capacitively coupled with said word line and positioned at two sides of the active region in the word line direction, and by setting OFF the following (m−1) pairs of the first and second control gates; and
 cyclically repeating this set of electrical states of the 2m number of control gates in the word line direction.

13. A method for operating a semiconductor memory device as set forth in claim 12, further comprising, at the same time of the division, a step of selecting a memory cell array including a plurality of discrete memory cells capable of parallel operation.

14. A method for operating a semiconductor memory device as set forth in claim 12, further comprising a step of shifting the positions of the first and second control gates in an OFF state each time by two (m−1) number of times in the word line direction in order to enable selection of the m (not less than 2) number of divided memory cell arrays one after another.

15. A method for operating a semiconductor memory device as set forth in claim 14, further comprising, each time the electrical state of said control gates is shifted by two in the word line direction, the steps of:
   selecting a word line again; and
   simultaneously writing, reading, or erasing the memory cells in parallel again in an electrically divided and selected memory cell array among the memory cells connected to the selected word line.

16. A semiconductor memory device comprising:
   a memory cell array including a plurality of memory cells, each having, alternately provided in a word line direction, an active region comprised of a first conductivity type semiconductor and impurity regions comprised of a second conductivity type semiconductor shared by adjacent memory cells;
   word lines capacitively coupled with the active regions;
   control gates capacitively coupled with the borders of the active regions with the impurity regions and electrically isolated from the word lines, each control gate partly overlapping two active regions adjoining the two sides of the impurity region in the word line direction; and
   a control circuit for driving the control gates to electrically divide the memory cell array in the word line direction and driving the impurity regions and the word lines in the divided memory cell array to write, read, or erase the plurality of memory cells in parallel,
   wherein the number of memory cells connected to one word line is J times an integer n not less than 3, and the memory cell array is divided into n number of memory cell arrays each including J number of memory cells according to the combination of the control gates that are set OFF by applying a specific cutoff voltage on the control gate at the division point and changing the borders of the two active regions from an electrical connection state to a cutoff state.

17. A semiconductor memory device as set forth in claim 16, wherein
   said memory cell is comprised of a nonvolatile memory transistor,
   the nonvolatile memory transistor comprises:
      a plurality of gate insulating films formed on said active region in which a channel of the transistor is formed and including a charge storing means in films or between films; and
      gate electrodes commonly connected by the word line, said control gate is provided on the plurality of gate insulating films and comprises a conductive layer buried in the space between gate electrodes with an insulating film in between.

18. A semiconductor memory device comprising:
   a memory cell array including a plurality of memory cells, each having, alternately provided in a word line direction, an active region comprised of a first conductivity type semiconductor and impurity regions comprised of a second conductivity type semiconductor shared by adjacent memory cells;
   word lines capacitively coupled with the active regions;
   a first control gate partly overlapping said active region in the vicinity of the border of the active region with an impurity region adjoining one side of the active region and a second control gate partly overlapping the active region in the vicinity of the border of the active region with another impurity region adjoining the other side of the active region are provided in pairs, the number of memory cells connected to one word line is K times an integer m not less than 2; and
   a control circuit for driving the first and second control gates to electrically divide the memory cell array in the word line direction and driving the impurity regions and the word lines in the divided memory cell array to write, read, or erase the plurality of memory cells in parallel,
   wherein said control circuit changes the borders of the corresponding active regions from an electrical connection state to a cutoff state when the first and second control gates are set OFF, and the memory cell array is divided into m number of memory cells arrays each including K number of memory cells according to the combination of the control gates set OFF.

19. A semiconductor memory device as set forth in claim 18, wherein
   said memory cell is comprised of a nonvolatile memory transistor,
   the nonvolatile memory transistor comprises:
      a plurality of gate insulating films formed on said active region in which a channel of the transistor is formed and including a charge storing means in films or between films; and
      gate electrodes commonly connected by the word line, and
      the first and second control gates comprise two conductive layers separated from each other and formed on the plurality of gate insulating films between the gate electrodes with insulating films on their side surfaces facing each other.

* * * * *